(12) United States Patent
Tomikawa et al.

(10) Patent No.: US 7,108,519 B2
(45) Date of Patent: Sep. 19, 2006

(54) ELECTRICAL CONNECTION BOX

(75) Inventors: Tadashi Tomikawa, Mie (JP); Shigeki Yamane, Mie (JP); Tomoki Kanou, Mie (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/099,551

(22) Filed: Apr. 6, 2005

(65) Prior Publication Data

US 2005/0221643 A1    Oct. 6, 2005

(30) Foreign Application Priority Data

Apr. 6, 2004  (JP) .......................... P2004-112409

(51) Int. Cl.
*H01R 12/00*  (2006.01)
(52) U.S. Cl. ..................................... 439/76.2; 439/949
(58) Field of Classification Search ............... 439/76.2, 439/79, 76.1, 949, 621; 361/752
See application file for complete search history.

(56) References Cited

U.S. PATENT DOCUMENTS

| | | | | |
|---|---|---|---|---|
| 5,229,922 A * | 7/1993 | Muramatsu et al. | ......... | 361/736 |
| 5,703,757 A * | 12/1997 | Hayes et al. | ................ | 361/752 |
| 6,514,091 B1 * | 2/2003 | Saito et al. | ................ | 439/76.2 |
| 6,600,658 B1 * | 7/2003 | Iwata | .......................... | 361/752 |
| 6,824,398 B1 * | 11/2004 | Hara | .......................... | 439/76.2 |
| 6,835,073 B1 * | 12/2004 | Kobayashi | ................ | 439/76.2 |
| 7,014,478 B1 * | 3/2006 | Yamashita et al. | ......... | 439/76.2 |
| 7,033,186 B1 * | 4/2006 | Kawakita et al. | ........... | 439/76.2 |
| 2006/0030173 A1 * | 2/2006 | Kawakita et al. | .......... | 439/76.1 |
| 2006/0030175 A1 * | 2/2006 | Yamane | ..................... | 439/76.2 |
| 2006/0084294 A1 * | 4/2006 | Kita | ......................... | 439/76.2 |

FOREIGN PATENT DOCUMENTS

JP    A 2001-025137    1/2001

* cited by examiner

*Primary Examiner*—Michael C. Zarroli
(74) *Attorney, Agent, or Firm*—Oliff & Berridge, PLC (57) ABSTRACT

An electrical connection box is described that includes a plurality of connector parts provided on a circuit substrate. Each of the plurality of connector parts may be provided at a different portion of the circuit substrate and may include an engaging portion that may engage with a mating connector part that is exposed outward from the case. In one exemplary embodiment, the connector parts are arrayed, respectively, on an upper circuit substrate and a lower circuit substrate. Therefore, cables extended from the upper connector part and cables extended from the lower connector part may be drawn from the mating connector in parallel and may be easily handled. For example, cables extended from the upper connector part and cables extended from the lower connector part run in parallel and in the same direction with the substrate, thereby making it possible to easily package the cables into one bundle.

7 Claims, 14 Drawing Sheets

ELECTRICAL CONNECTION BOX

BACKGROUND OF THE INVENTION

1. Field of the Invention

The present invention relates to an electrical connection box.

2. Description of the Related Art

The electrical connection box described in JP-A-2001-025137 has been known so far as an example to be installed in an automobile and others. It includes a rectangular flat-shaped base being mold-coated bus bars in a case and connector parts fixed respectively on four side edges of the base, wherein terminals accommodated in connector parts are respectively connected to an end of the bus bar. Each connector part is provided with a hood in which a terminal is allowed to project inwardly, and a mating connector is fitted into each hood, by which the mating terminal connected with an end of an cable is electrically connected to the terminal.

SUMMARY OF THE INVENTION

In the above case where each hood is opened in four directions, it is necessary to be fitted into a mating connector in a different direction. If so, the cable connected with the mating terminal is separately drawn from the electrical connection box in a form scattered in four directions, resulting in a problem of handling the cable.

In addition, when hoods are opened in four directions, there is a concern that water may enter into any hood at a higher probability.

The present invention has been made in view of the above problem, and one of objects thereof is to improve the handling of cables. Another object of the invention is to secure waterproof property.

According to one aspect of the invention, there is provided an electrical connection box including: a circuit substrate having a conducting channel formed thereon; a case that accommodates the circuit substrate; a plurality of connector parts provided on the circuit substrate and having an engaging portion that engages with a mating connector part, the engaging portion being exposed outward from the case; and a plurality of conductive members that are electrically connected to the conducting channel, wherein an end portion of the conductive members is accommodated within the connector parts respectively, and wherein each of the connector parts is provided to be engaged with a respective mating connector in a direction parallel to the circuit substrate and the direction same with one another.

BRIEF DESCRIPTION OF THE DRAWINGS

The objects and advantages of the present invention will become more apparent by describing preferred embodiments thereof in detail with reference to the accompanying drawings, wherein.

DETAILED DESCRIPTION OF THE PREFERRED EMBODIMENTS

Figure 1:
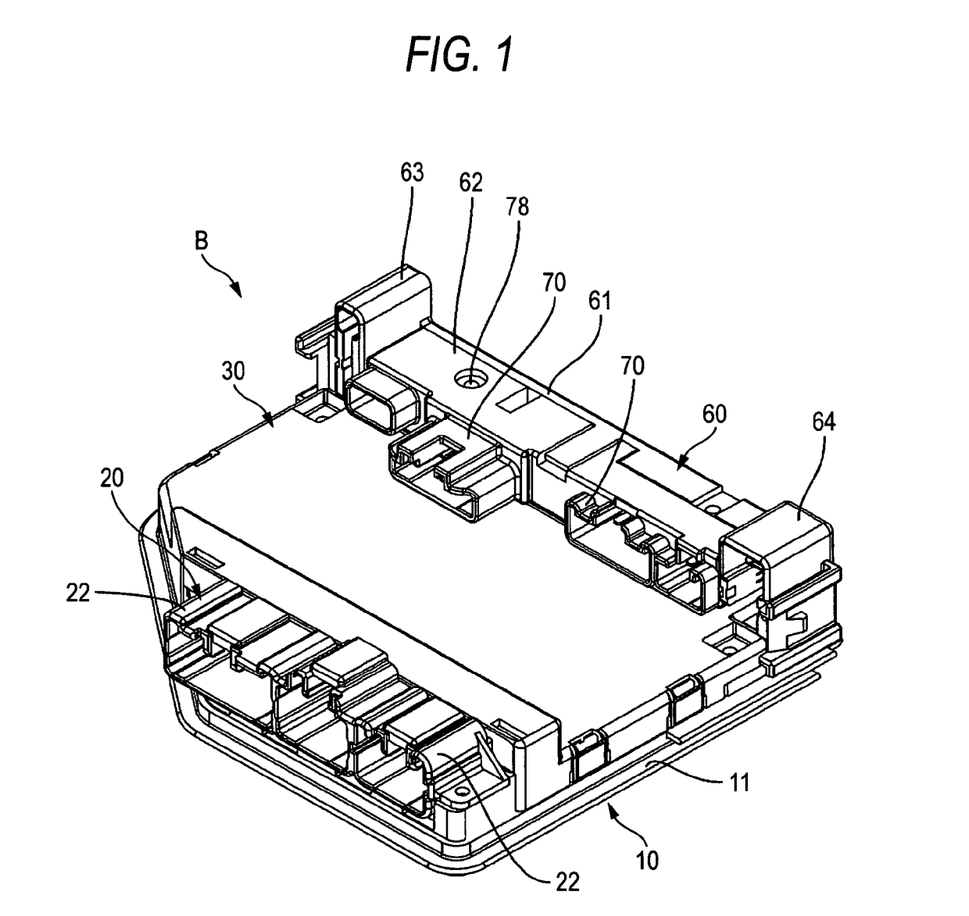
FIG. 1 is a perspective view of the electrical connection box showing an embodiment of the present invention.

An embodiment of the present invention will be described with reference to FIG. 1 or FIG. 17. FIG. 1 shows an overview of the electrical connection box B of the embodiment. The electrical connection box B is provided with a case consisting of a lower case 10, a cover 30, and a circuit component 50 accommodated in the case. In the following description, the front is regarded as the left side in FIG. 1 or FIG. 15 and the vertical direction is based on FIG. 1 or FIG. 15.

Figure 10:
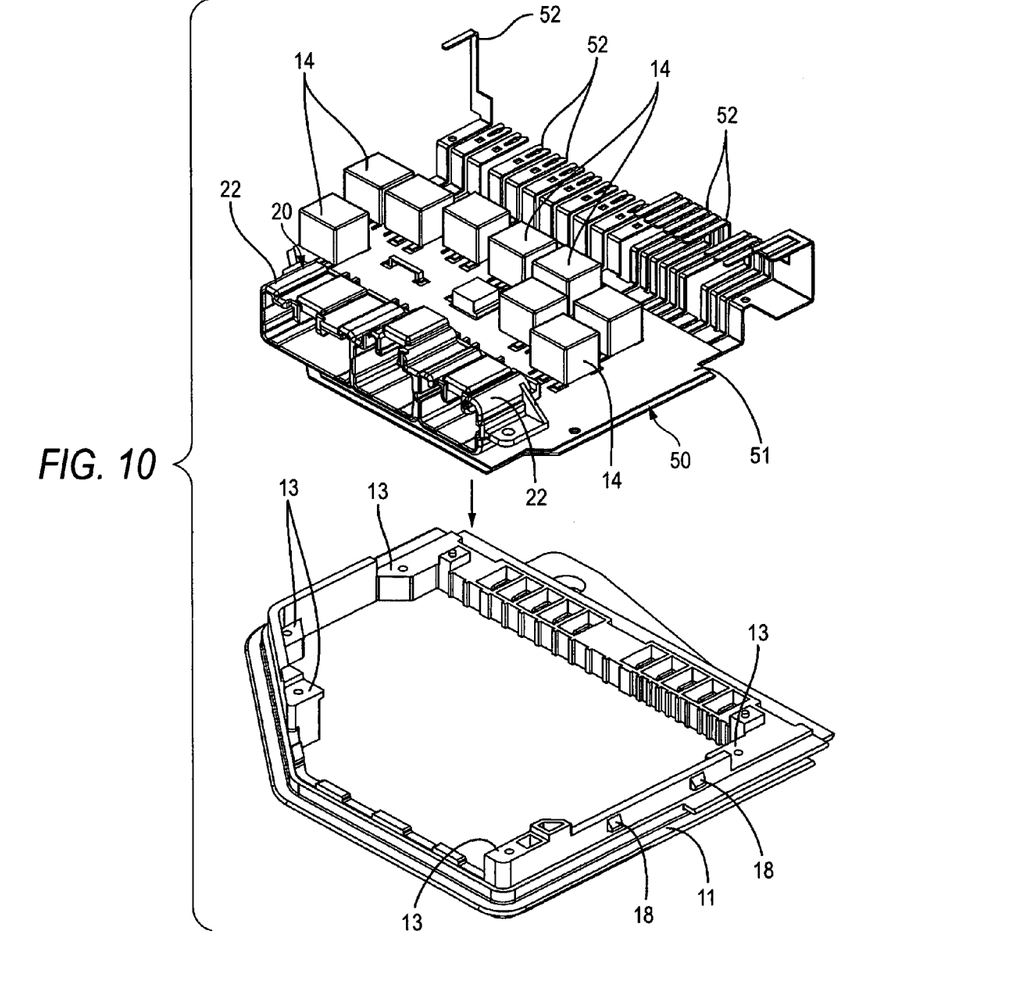
FIG. 10 is a perspective view showing a state that the circuit component is assembled to the frame.
Figure 11:
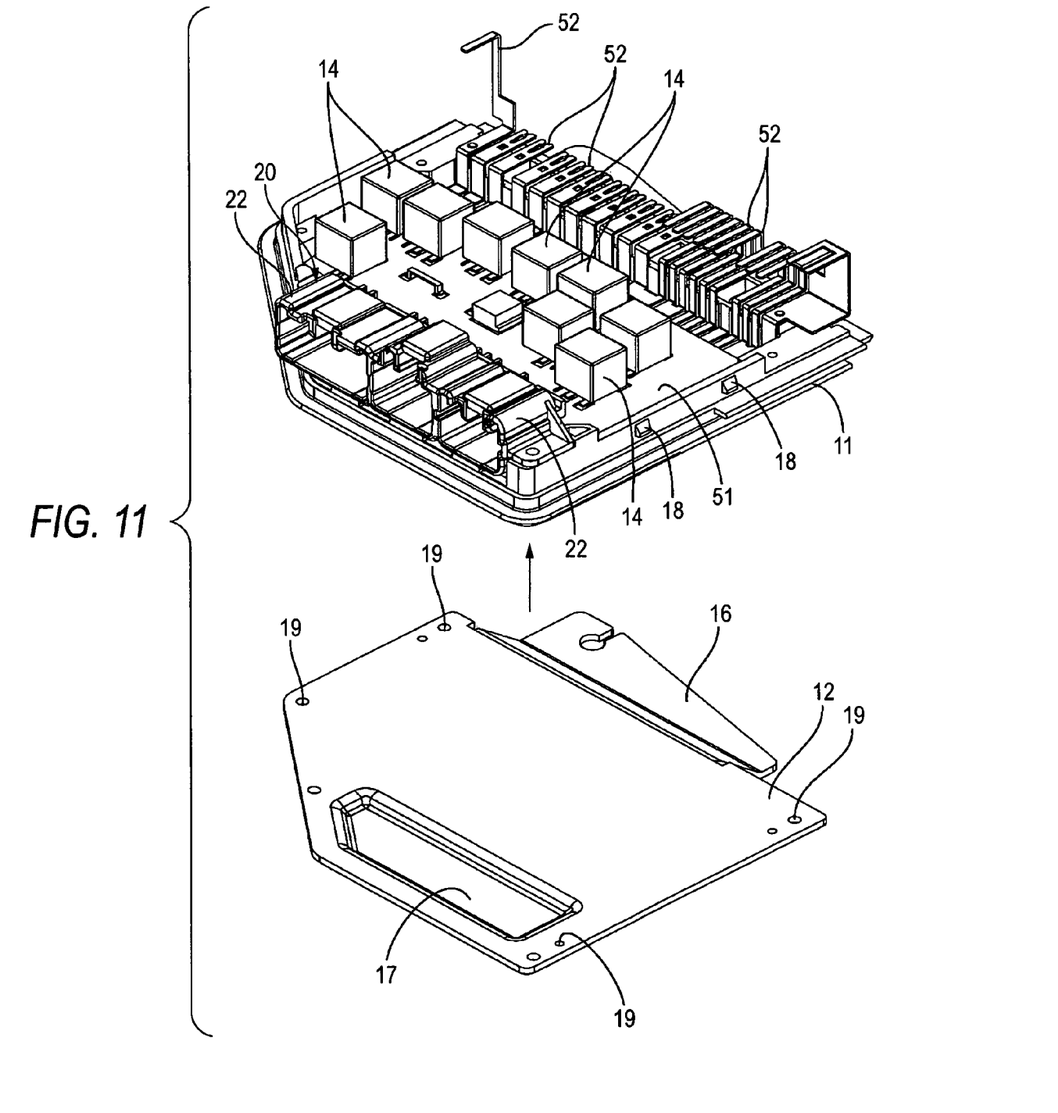
FIG. 11 is a perspective view showing a state that the heat sink is assembled to the frame.
Figure 18:
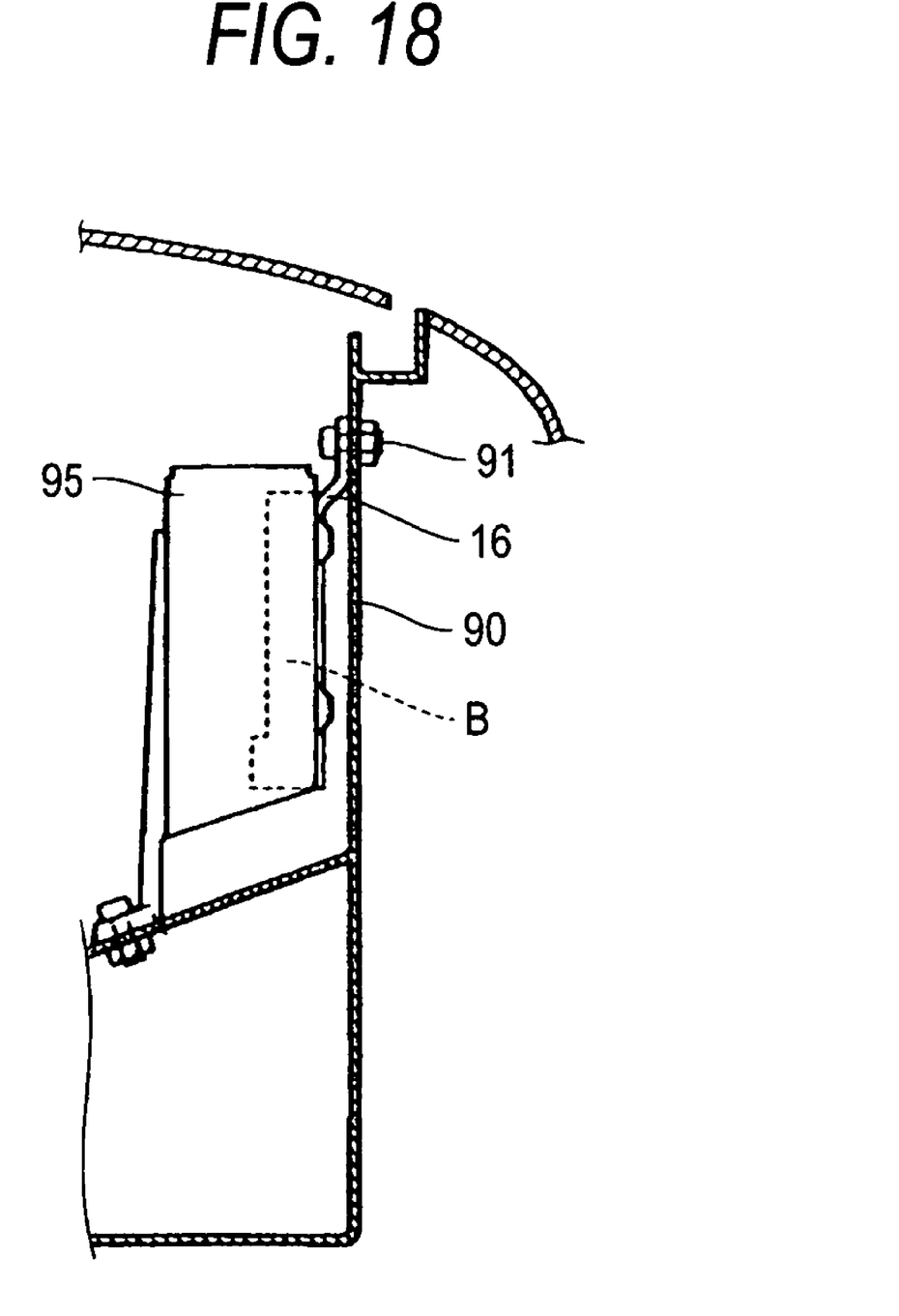
FIG. 18 is a schematic view showing a use state.

The lower case 10 is shaped in a box form, with the upper plane opened, comprising a frame 11 corresponding to a peripheral wall and a heat sink 12 corresponding to a bottom wall. As shown in FIG. 10, the frame 11 is made of a synthetic resin and shaped in a polygonal form, and a supporter 13 for placing the cover 30 and the lower connector part 20 is provided at the corner and others inside the frame. As shown in FIG. 11, the heat sink 12 is to radiate heat generated from the electrical component 14, for example, a relay, and shaped in a flat plate form with a metal such as aluminum. Plural screw holes 19 are provided on a peripheral part of the heat sink 12 at a predetermined interval, and the heat sink 12 is fixed to the frame 11 by screws which are inserted into the screw holes 19. Further, a fixing piece 16 is provided in a form extending from the back edge of the heat sink 12 out of the case and, as shown in FIG. 18, the fixing piece 16 is attached on a vehicle panel 90 and fixed with the bolt 91. A concave portion 17 is provided on the surface of the heat sink 12 for passing the front end of the terminal 21 accommodated in the lower connector part 20 to be described later.

Figure 12:
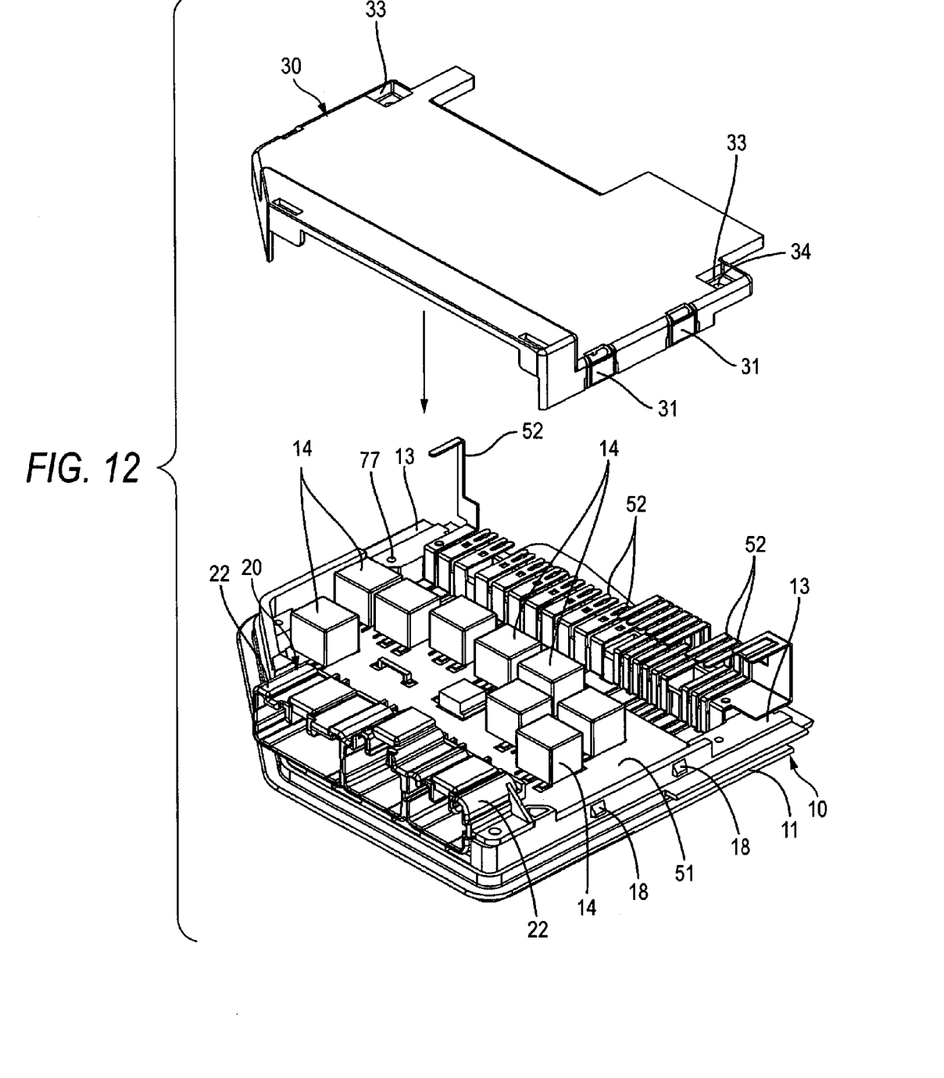
FIG. 12 is a perspective view showing a state that the cover is on the lower case.
Figure 16:
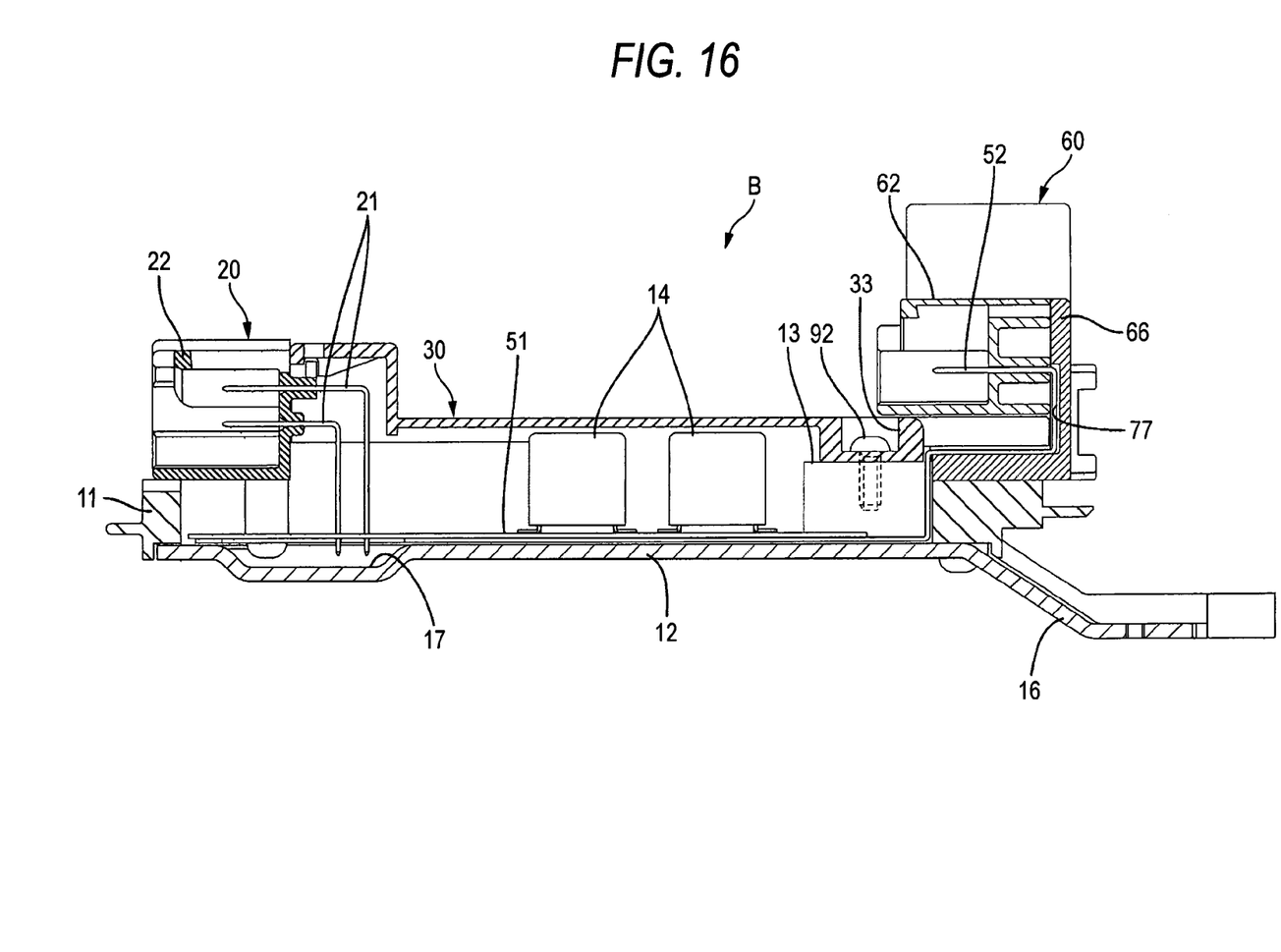
FIG. 16 is a sectional side view of a bus-bar accommodating part.

A cover 30 is formed of a synthetic resin and assembled to the lower case 10 so as to cover above the circuit component 50, as shown in FIG. 12. Both the front and back faces of the cover 30 are opened, and a lower connector part 20 and an upper connector part 60 are mounted so as to close these openings. The respective parts fitted into their mating connectors (not illustrated) of the lower connector part 20 and the upper connector part 60 are allowed to be exposed to the outside of the case from an opening of the cover 30. Both the right and left sides of the cover 30 are provided with a flexible lock piece 31. The lock piece 31 is engaged resiliently with the lock projected part 18 mounted on the frame 11, by which the cover 30 is tentatively fixed to the lower case 10. Further, the fixing part 33 is provided with both back ends of the cover 30, and, as shown in FIG. 16, the screw 92 is screwed from the engaging hole 34 of the fixing part 33 into the screw hole of the corresponding supporter 13, by which the cover 30 is fixed to the lower case 10.

Figure 9:
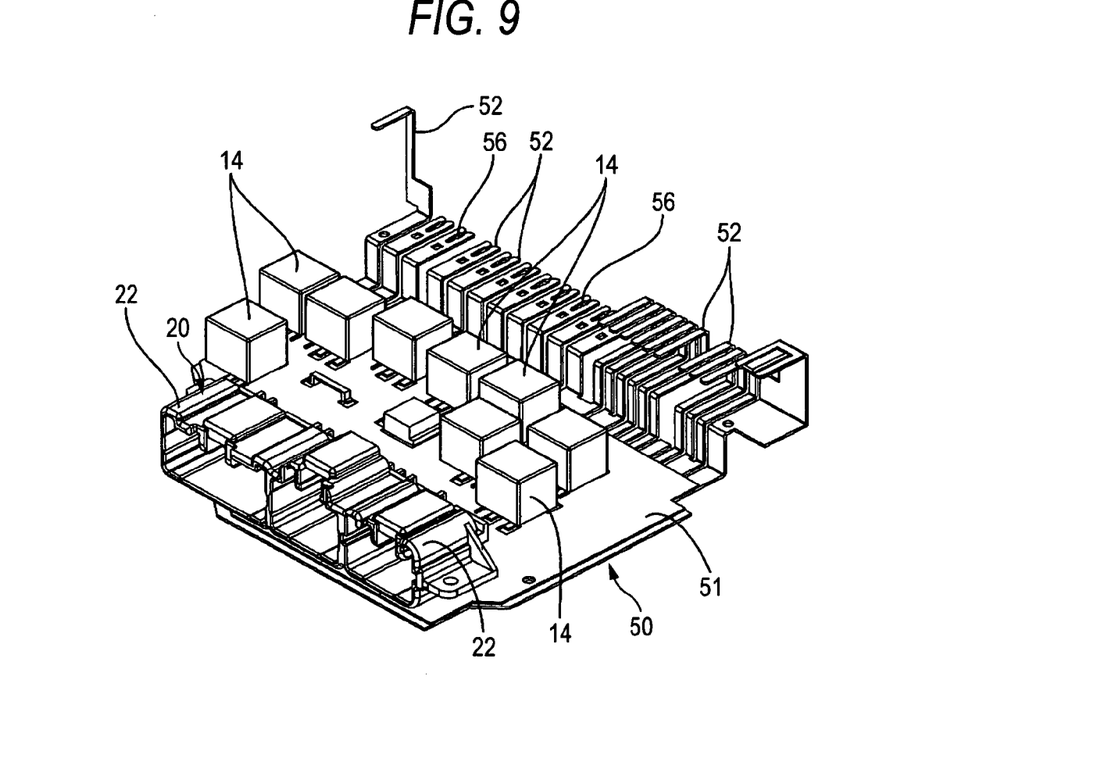
FIG. 9 is a perspective view showing a state that the lower connector part is connected to the circuit substrate.

Also, as shown in FIG. 9, the circuit component 50 is made up of a circuit substrate 51 having an electrical component 14, for example, a relay shaped in a rectangular form, on the surface, a bus bar 52 arrayed on the back face of the circuit substrate 51, and an insulating sheet member 53 provided between the bus bar 52 and the circuit substrate 51. A conducting channel is provided on both the front and back faces of the circuit substrate 51, and the electrical component 14, for example, a relay, is connected by soldering to a predetermined position of the conducting channel.

The bus bar 52 is formed by punching out the conductive metal sheet and bending it to a predetermined shape. The bus bars 52 are arrayed along the back face of the circuit substrate 51, with the front end exposed outside the back end of the circuit substrate 51. Of these bus bars 52, some of them (A group illustrated in FIG. 7) are bent two times at a right angle on the surface of the substrate 51, with the front end projected backward in an approximately horizontal direction, and also provided with a slit 56 into which a fuse is inserted. Further, the specified bus bars 52 (B group illustrated in FIG. 7) are bent inward additionally two times at a right angle so as to be folded approximately in a U shape, with the front end projected forward in an approximately horizontal direction.

Figure 3:
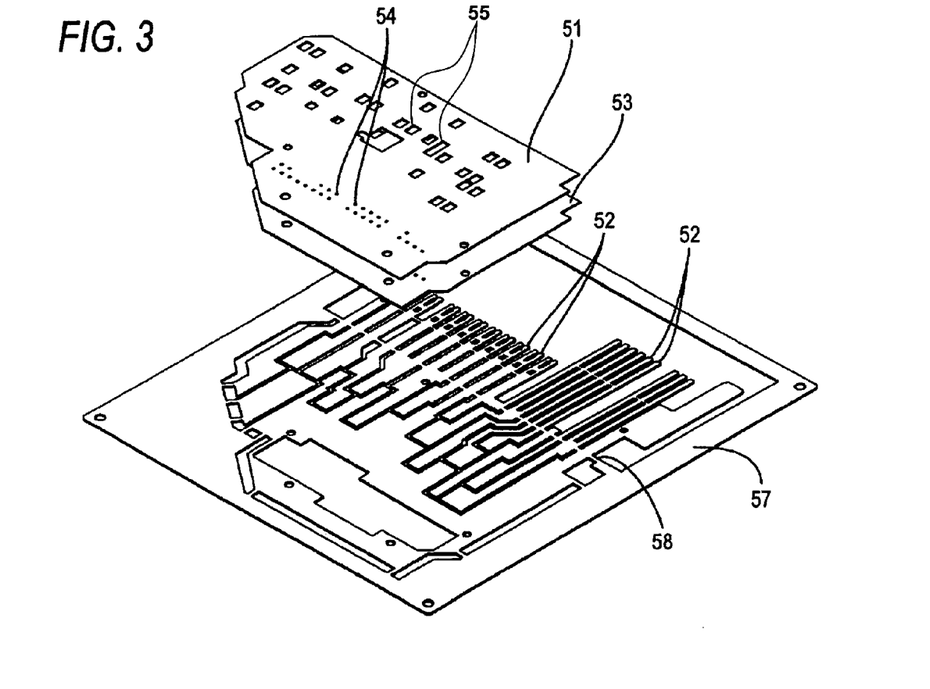
FIG. 3 is a perspective view showing a state that a circuit substrate is adhesively attached to a bus bar.

As shown in FIG. 3, the insulating sheet member 53 is shaped in a form corresponding to a contour of the circuit substrate 51, connected communicatively with the through-hole 54 of the circuit substrate 51 and provided with a through hole (not illustrated) through which the bus bar 52 is passed therebelow. The insulating sheet member 53 is adhered on the back face of the circuit substrate 51 and the surface of the bus bar 52, so that the circuit substrate 51 can be integrally connected with the bus bar 52. It is also able to electrically connect the circuit substrate 51 with the bus bar 52 via a through-hole 55 by soldering.

In addition, the upper connector part 60 is provided on the back end of the circuit substrate 51 (on the upper end when viewed in use), whereas the lower connector part 20 is provided on the front end of the circuit substrate 51 (on the lower end when viewed in use). The upper connector part 60 can be divided into a fuse box 61 and a housing part 62.

Figure 13:
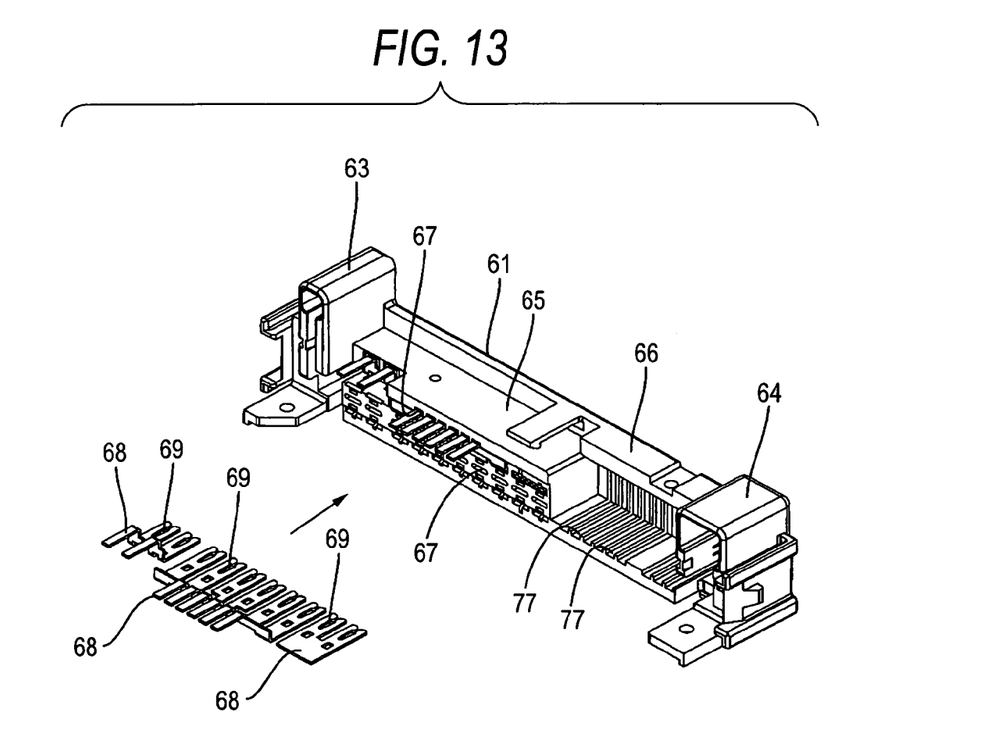
FIG. 13 is a perspective view showing a state that the terminal is attached to the fuse box.

As shown in FIG. 13, the fuse box 61 is formed of a synthetic resin in a length to cover the entire width of the back edge of the case, covering the front end of the bus bar 52, and fixed to the back edge of the case with screws from behind. This fuse box 61 is comprised of a first hood part 63 and a second hood part 64 provided on the longitudinal both ends in a longitudinal form, a fuse attaching part 65 provided adjacent to the first hood part 63 in a wide form and a bus-bar accommodating part 66 interposing between the fuse attaching part 65 and the second hood part 64.

When the fuse box 61 is assembled to the case, as shown in FIG. 16, the approximately U-shaped front end of the bus bars 52 (B group illustrated in FIG. 7) is accommodated in the bus-bar accommodating part 66, the first hood part 63 and the second hood part 64. The bus bar accommodating part 66 is provided with an approximately U-shaped positioning groove 77 over the entire inner wall, and the front end of the bus bar 52 is positioned and held along the positioning groove 77. Further, mating connectors (not illustrated) are fitted into the first hood part 63 and the second hood part 64 from the front, and the front end of the bus bar 52 opposed to the mating terminal which is accommodated in the mating connector is electrically connected. A mating connector which supplies electricity to a generator is fitted inside the first hood part 63, and a mating connector which supplies electricity to a battery is fitted inside the second hood part 64.

The fuse attaching part 65 is formed in a horizontally-long block shape, and provided therein with terminal attaching holes 67 constituted vertically by two stages and longitudinally by plural rows. The front end of the bus bars 52 (A group illustrated in FIG. 7) is pressed into the lower terminal attaching hole 67, whereas a strip-shaped terminal 68 is pressed into the upper terminal attaching hole 67. Further, FIG. 13 shows a state after the terminal 68 is assembled to the terminal attaching hole 67 of the fuse attaching part 65.

The terminals 68 attached by inserting into the upper terminal attaching holes 67 are arrayed so as to project above the cover 30, and a fuse inserting slit 69 is provided on the front end. A fuse 80 is inserted between the slit 69 of the terminal 68 and the slit 56 of the bus bar 52, by which the terminal 68 is electrically connected with the bus bar 52.

Figure 15:
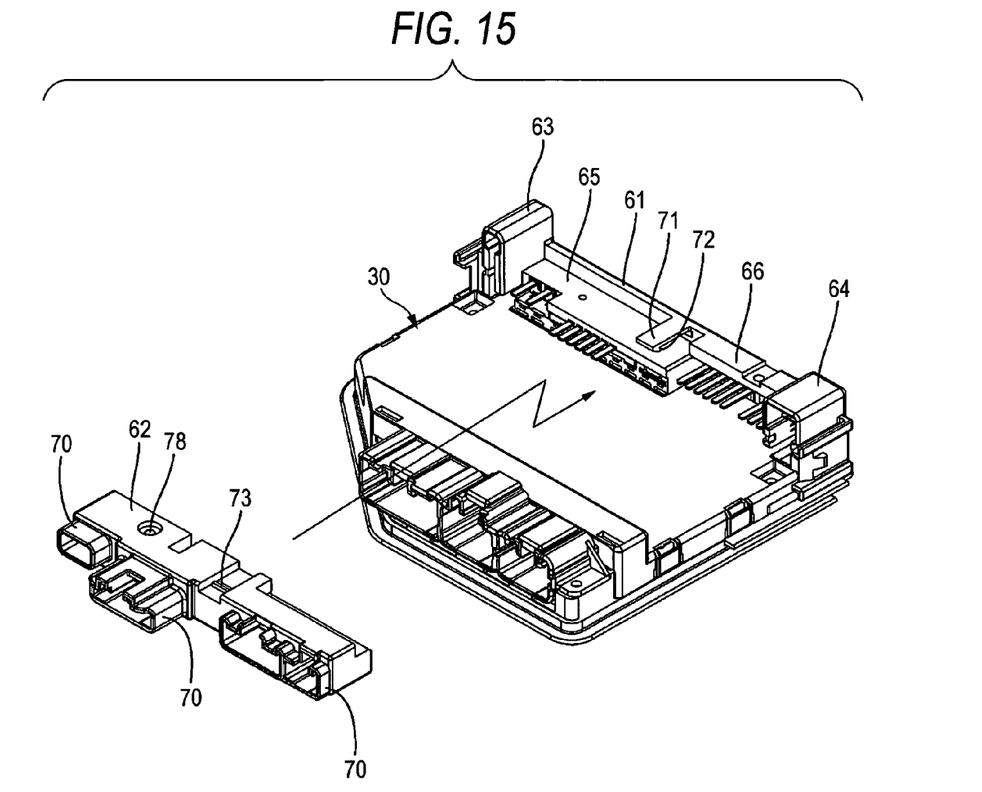
FIG. 15 is a perspective view showing a state where the housing part is assembled to the fuse box.

As shown in FIG. 15, the housing part 62 is formed of a synthetic resin and provided on the front plane with four hood-shaped connector parts (or engaging portions) 70 having an opening back and forth in line. Therefore, each connector part 70 has the opening in parallel with the cover 30 or in parallel with the circuit substrate 51. As shown in FIG. 16 and FIG. 17, the housing part 62 is assembled from the front so as to cover the respective front parts of the bus bar accommodating part 66 and the fuse attaching part 65, by which the corresponding bus bar 52 and terminal 68 are arrayed in a projected form inside each connector part 70. The mating connector (not illustrated) is fitted into each connector part 70 from the front, by which the bus bar 52 and the terminal 68 are electrically connected with the mating terminals accommodated in the mating connector. The flexible locking piece 71 is provided around the center of the fuse box 61 upper end in the width direction, and the front end claw part 72 of the locking piece 71 is resiliently locked by the lock receiving part 73 provided on the housing part 62, by which the housing part 62 is tentatively fixed to the fuse box 61 and subsequently fixed thereto by passing a screw (not illustrated) through the screw hole 78.

As shown in FIG. 15, each of the lower connector part (a lower connector group) 20 and the upper connector part (an upper connector group) 60 has a hood portion that is provided to be spaced apart from end portions of the terminals 21, 68 (conductive members) and covers outer peripheral of the end portions of the terminals 21, 68.

Figure 8:
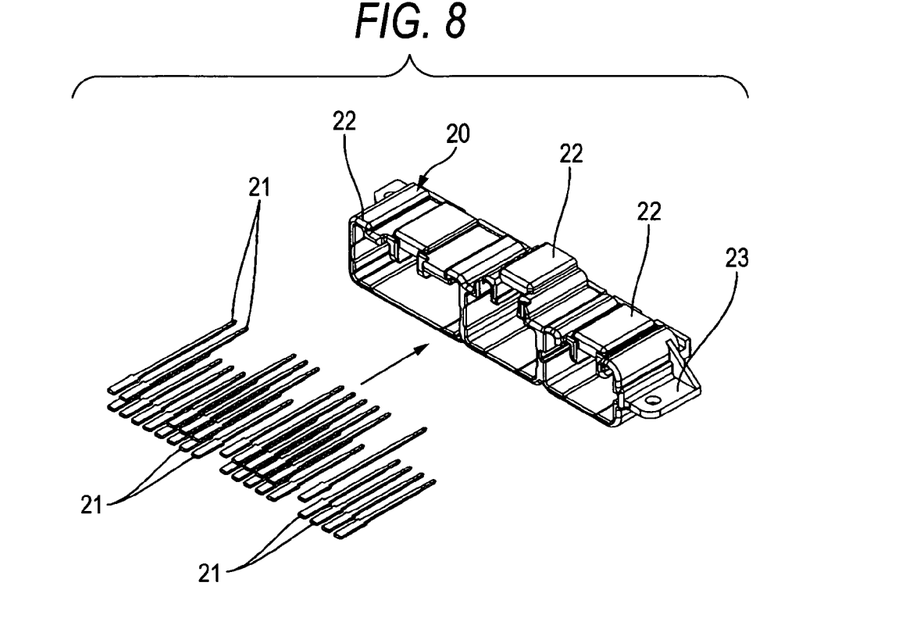
FIG. 8 is a perspective view showing a state that terminals are attached to the lower connector part.

As shown in FIG. 8, the lower connector part 20 at the front end of the case is formed of a synthetic resin and provided with three hood-shaped connector parts (or engaging portions) 22 opening to the front in line. Then, the lower connector part 20 is formed so as to have a length to cover the entire width of the back edge of the circuit substrate 51, the upper plane is generally positioned lower than the upper connector part 60 so as to be behind the upper connector part 60, when viewed from the back.

Figure 17:
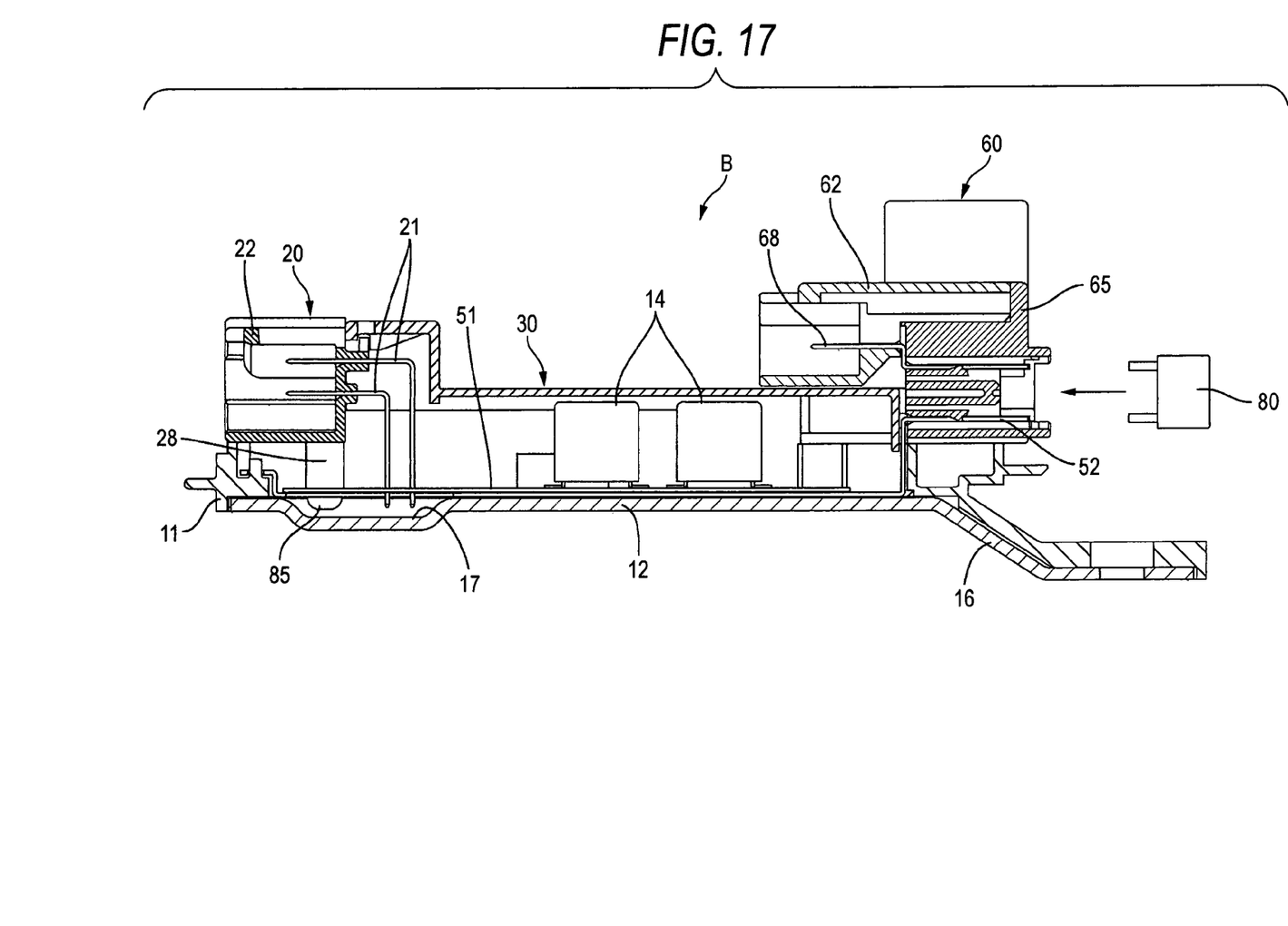
FIG. 17 is a sectional side view of a fuse attaching part.

As shown in FIG. 16 and FIG. 17, a terminal 21 is pressed into the back wall of each connector part 22. Such a terminal 21 is arrayed into the connector part 22 in a projected form, the front end is extended backward from the back wall and bent at a right angle along the way, the front end is inserted into the through-hole 54 of the circuit substrate 51 and connected to the back face of the circuit substrate 51 by soldering. Further, a solidifying part 23 is formed on both ends of the lower connector part 20 in a lateral projection, and the solidifying part 23 is placed on the supporter 13 of the frame 11 and fixed firmly with the frame 11. Further, as shown in FIG. 17, the lower connector part 20 is provided with the fixing part 28 projecting toward the circuit substrate 51, and fixed to the circuit substrate 51 by the screw 85 put through from below. The mating connector (not illustrated) is fitted from the front into each connector part 22, and electrically connected with the terminal 21 opposed to the mating terminal which is accommodated in the mating connector.

Figure 2:
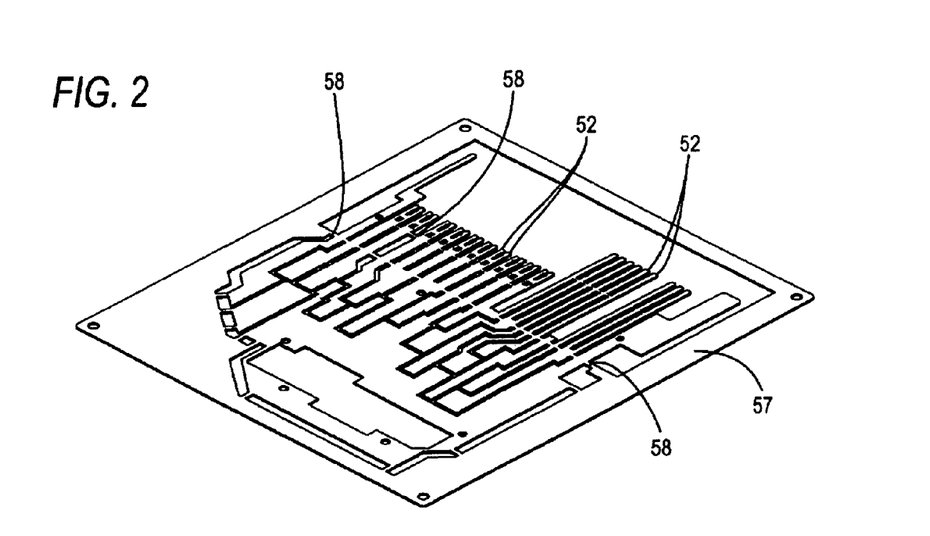
FIG. 2 is a perspective view showing a state that bus bars are formed inside the outer frame.

Next, a manufacturing method of the above-structured electrical connection box B will be described. As shown in FIG. 2, bus bars 52 are arrayed at a predetermined pattern inside the rectangular outer frame 57 on a conductive metal sheet. In this case, the bus bars 52 are connected to each other at a predetermined position via the joining part 58, and also connected between the bus bar 52 and the outer frame 57 at a predetermined position via the joining part 58.

Then, as shown in FIG. 3, an adhesive insulating sheet member 53 is placed between the bus bar 52 and the circuit substrate 51, thereby integrally adhering the bus bar 52 to the circuit substrate 51.

Figure 4:
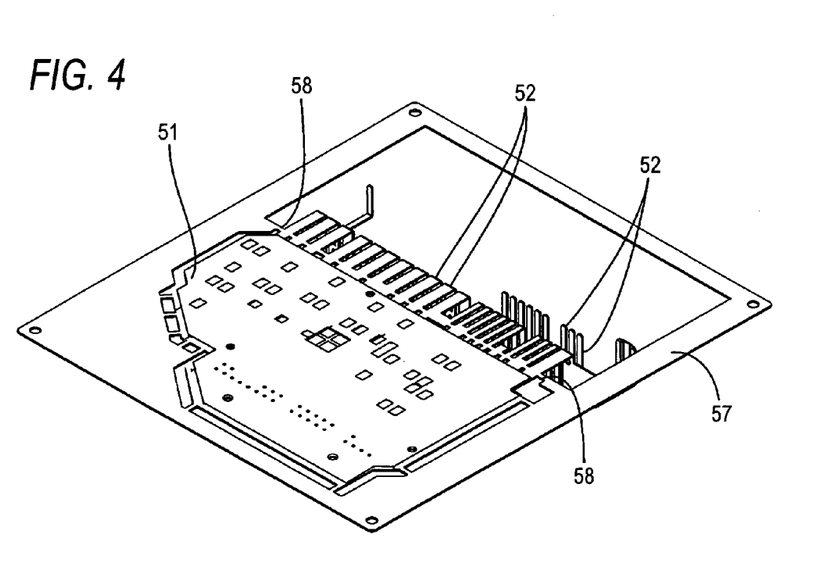
FIG. 4 is a perspective view showing a state that the front end of the bus bar is bent downward.
Figure 5:
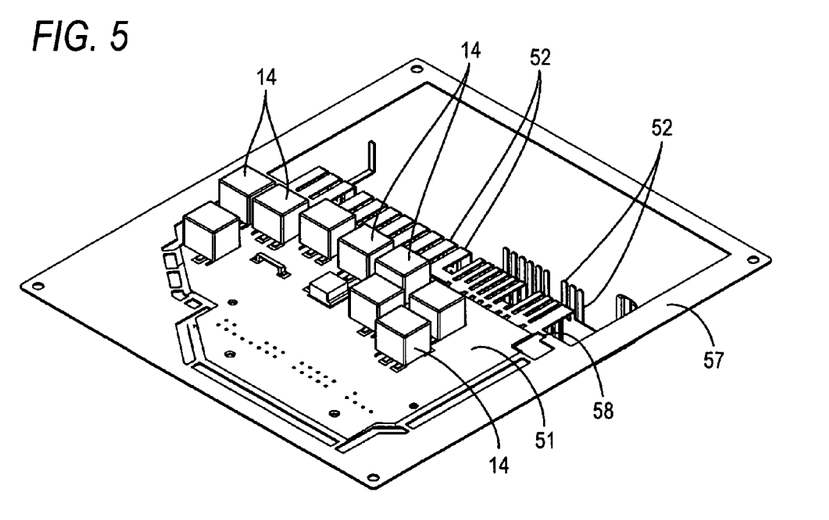
FIG. 5 is a perspective view showing a state that an electrical component is fixed to the circuit substrate.

Next, as shown in FIG. 4, the front end of the bus bar 52 is bent downward and retracted so as not to project toward the surface of the circuit substrate 51. Solder is coated on the surface of the circuit substrate 51 screen printing (preferably lead-free solder), and the electrical component 14 is placed on the solder to pass through a high-temperature furnace to melt the solder. Thereby, as shown in FIG. 5, the electrical component 14, for example, a relay, is mounted on the surface of the circuit substrate 51.

Figure 6:
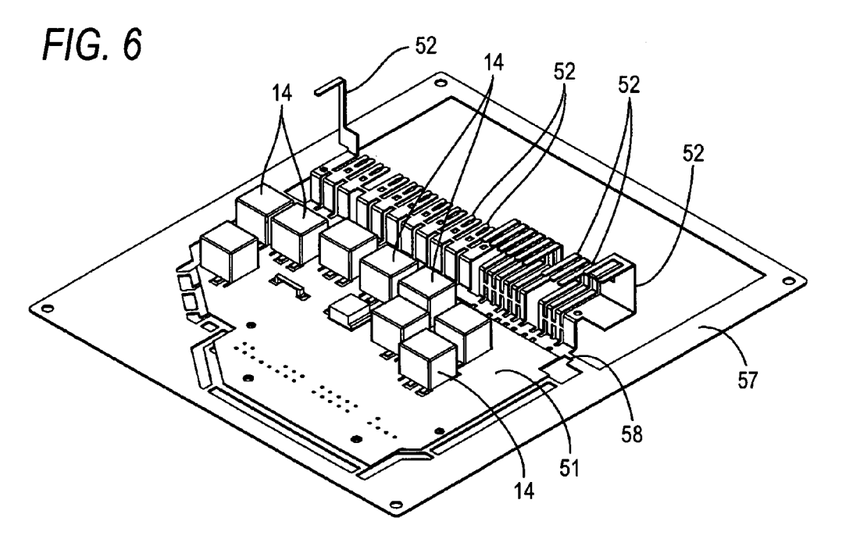
FIG. 6 is a perspective view showing a state that the front end of the bus bar is bent upward.
Figure 7:
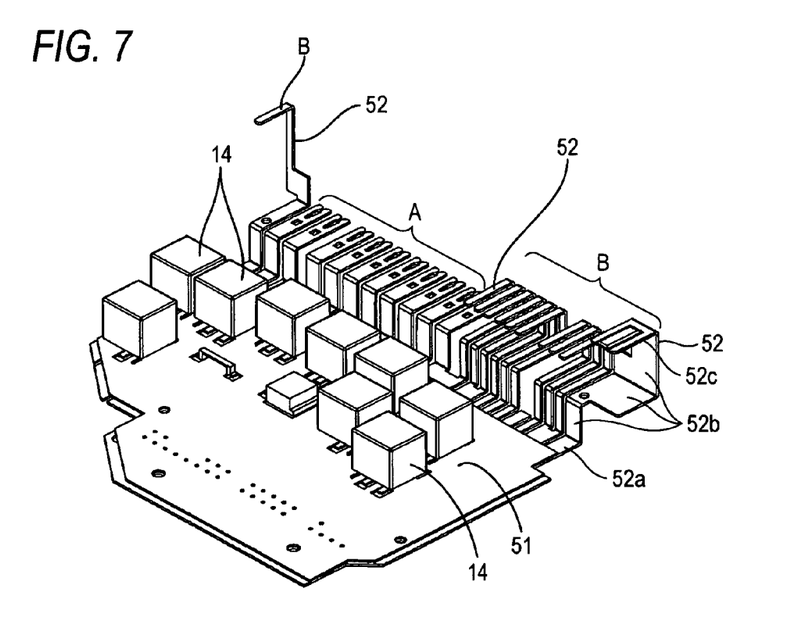
FIG. 7 is a perspective view showing a state that the outer frame is cut off.

As shown in FIG. 6 and FIG. 7, the front end of the bus bar 52 is bent upward so as to project toward the surface of the circuit substrate 51, and the joining part 58 is cut to separate the bus bar 52 from the outer frame 57. After or before this process, as shown in FIG. 8, the terminal 21 is pressed into the lower connector part 20 from the front or as indicated by the arrow, and a part projected from the back face is bent at a right angle along the way to form approximately a letter L. Then, as shown in FIG. 9, the lower connector part 20 is placed on the surface of the circuit substrate 51 and allowed to penetrate a through-hole 54 of the circuit substrate 51 corresponding to the front end of the terminal 21 in the course of such placement. The fixing part 28 is fixed with a screw 85 and connected to the back face of the circuit substrate 51 by flow soldering or another method, thus completing assembly of the circuit component 50.

As shown in FIG. 10, the circuit component 50 is fitted into the frame 11 and an adhesive agent is applied to the back faces of both the circuit component 50 and the frame 11. An insulating adhesive agent is also applied to the surface of the heat sink 12, and as shown in FIG. 11, the circuit component 50 and the heat sink 12 are integrally assembled by using the adhesive agent. The heat sink 12 is fixed with a screw to the frame 11 and firmly adhered between the heat sink 12 and the frame 11, whereby the lower case 10 is completely assembled.

Figure 14:
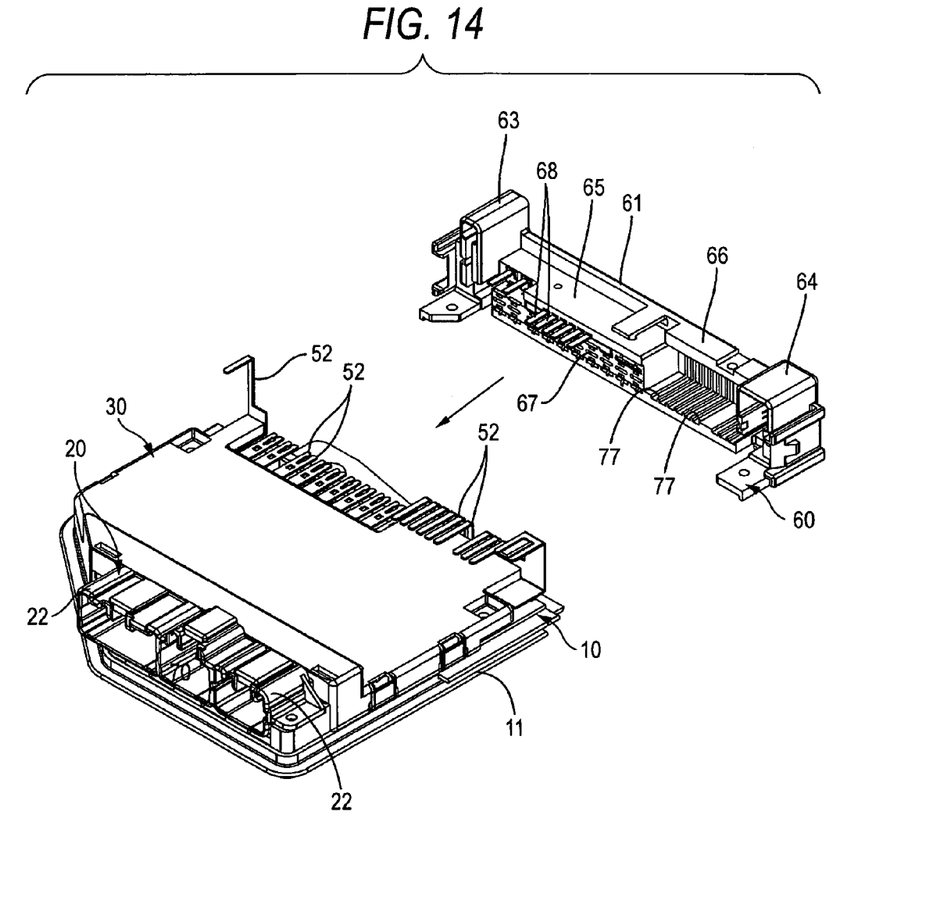
FIG. 14 is a perspective view showing a state where the fuse box is assembled to the case.

Subsequently, gel is injected into the frame 11 to cover the surface of the circuit substrate 51, thereby maintaining the waterproof property. Then, as shown in FIG. 12, the cover 30 is assembled from above or as indicated by the arrow. The lock piece 31 of the cover 30 is locked resiliently with the lock projected part 18 of the lower case 10, and a screw 92 is inserted from the fixing part 33 to the supporter 13, thereby fixing the cover 30 to the lower case 10. Then, as shown in FIG. 14, the fuse box 61 on which the terminal 68 is previously mounted is assembled to the back edge of the case. In association with assembly of the fuse box 61, the bus bars 52 (A group illustrated in FIG. 7) are pressed into the lower terminal attaching holes 67 on the fuse box 61, and as shown in FIG. 17., the front end of the bus bar 52 is electrically connected to the front end of the terminal 68 by means of the fuse 80 to be attached later. Then, as shown in FIG. 15, the housing part 62 is allowed to slide along the upper plane of the cover 30 and assembled to the front plane of the fuse box 61. Thereafter, the mating connector is fitted into the upper connector part 60 from the front, whereas the mating connector is fitted into the lower connector part 20 from the front.

As shown in FIG. 18, the thus completely assembled electrical connection box B is accommodated vertically in a box (attachment objective member) 95, for example, a relay box 95, with the upper connector part 60 pointed upward, and fixed, as it is, to the automobile panel 90 on the fender of the engine room through the fixing piece 16 of the heat sink 12. Therefore, when the box is actually used, the respective connector parts 22 and 70 on the upper connector part 60 and the lower connector part 20 are arrayed, with the opening that opens downward, and the lower connector part 20 is positioned behind the upper connector part 60, when viewed from above.

That is, the lower connector part (the lower connector group) 20 is provided within a projective area of the upper connector part (the upper connector group) 60 when viewed from vertical direction in a state where the electrical connection box B is attached to the attachment objective member (the box 95).

The mating terminal accommodated in the mating connector is connected to the end of a cable, and a plurality of cables (hereinafter referred to as a cable group) extend downward from the connector parts 22 and 70 respectively on the upper connector part 60 and the lower connector part 20. In this case, the cable group drawn from the connector part 70 of the upper connector part 60 extends in parallel with the circuit substrate 51 along the surface of the cover 30 and also downward, passes above the connector part 22 of the lower connector part 20 along the way, and extends downward outside the case. Then, since the cable group drawn from the connector part 22 of the lower connector part 20 extends downward, as it is, both of the cable groups overlap each other outside the case, thereby making it possible to handle these cable groups in an integrated manner. As a result, the cable groups can be easily packed into one bundle, for example. In addition, the cable groups are drawn out along the surface of the cover 30, thus making it possible to use a space in front of but outside the case effectively.

As described above, according to the embodiment, the respective connector parts 22 and 70 on the upper connector part 60 and the lower connector part 20 are fitted into the mating connectors in parallel with and in the same direction with the circuit substrate 51, thereby making it possible to keep cables drawn from the mating connectors in parallel with and in the same direction with the circuit substrate 51 and handle the cables appropriately. Further, since the lower connector part 20 is positioned behind the upper connector part 60 when viewed from above, the cables can be handled more appropriately.

The case is placed vertically (i.e. the circuit substrate 51 is placed vertically) in a vertical direction (up-and-down direction). The respective connector parts 22 and 70 on the upper connector part 60 and lower connector part 20 are shaped in a hood form, with the opening that opens downward. Therefore, if water is splashed on the case, water immersion into the connector part 22 or 70 can be prevented, thereby maintaining the waterproof property. Further, such water will drops from the upper connector part 60 and scarcely contact with the lower connector part 20, thus making it possible to maintain the waterproof property the lower connector part 20 more effectively.

The specified bus bars 52 (B group illustrated in FIG. 7) are bent and folded approximately in a U shape in such a way that the front ends project respectively toward the connector part 70, the first hood part 63 and the second hood part 64. Thus, there is no need for providing contact points between the conductive channels in making the folded shape, thereby avoiding contact resistance.

That is, at least a part of the bus bars 52 (B group illustrated in FIG. 7) includes: an attachment portion 52a that is attached to the circuit substrate 51; an upraised portion 52b that is upraised from the attachment portion 52a by bending; and an extending portion 52c that is bent from the upraised portion 52b and extends in a direction opposite to an extending direction of the attachment portion 52a. An end portion of the extending portion 52c is provided to protrude inside the upper connector part 60.

Since each connector part is fitted into the mating connector in parallel with and in the same direction with the substrate, a cable can be drawn from the mating connector in parallel with and in the same direction with the substrate, thereby making it possible to handle the cable appropriately. As a result, cables taken out can be easily handled, for example, and can be packed into one bundle.

Since the substrate is vertically disposed and respective connector parts are formed in a hood form and arrayed, with the opening that opens downward, even if water is splashed to the case from above, water can be prevented from entering into the connector part to secure waterproof property.

Since the connector parts are arrayed respectively on an upper circuit substrate and a lower circuit substrate, cables extended from the upper connector part and those extended from the lower connector part can be properly placed on the same line and these cables can be easily packed into one bundle.

In the embodiment, the connector part on the lower circuit substrate is arrayed so as to be positioned behind the connector part on the upper circuit substrate, when viewed from above. Thus, even if water is splashed on the case, such water flows down from the above connector part and scarcely contacts with the lower connector part, thus making it possible to keep the lower connector part away from water more effectively.

The conductive member is bent and folded so that the end projects into the connector part, thus making it possible to form such a folded structure without providing contacts between members, thereby avoiding generation of contact resistance.

Where it is difficult to bend a conductive member, a terminal is connected with a bus bar by welding or pressure welding, thereby forming various shapes including a folded shape, and increasing the degree of freedom in designing an electrical connection box.

Where it is difficult to bend a conductive member, a conductive member is made up of a bus bar, a terminal, and a member for connecting the bus bar and the terminal, thereby forming various shapes including a folded shape. It is also possible to reduce the work load by removing welding between members.

The present invention shall not be limited to the embodiment described with reference to the above description and figures. For example, the following embodiments are also included in the technical field of the invention. In addition, the invention can be executed in various modifications other than the examples shown below without deviating from the scope of the present invention.

(1) The bus bars and the terminals accommodated in the upper connector part may be connected by welding or pressure welding. Alternatively, the bus bars and the terminals accommodated in the upper connector part may be connected through a relay member, for example, a relay terminal. Such connection makes it possible to provide various shapes including a folded shape, even where it is difficult to conduct a bending process.

(2) The upper connector part is constituted by the fuse box and the housing part. However, the upper connector part may be constituted as an ordinary connector part without a fuse being interposed, as with the lower connector part.

(3) In the above described embodiment, the plurality of the connector parts are provided on the circuit substrate and each connector part has a part fitted into at least a mating connector which is exposed outside the case. The connector part may be fitted into the mating connector in parallel with and in the same direction with the circuit substrate, by which cables can be handled appropriately.

Although the present invention has been shown and described with reference to specific embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. An electrical connection box comprising:
   a circuit substrate;
   a case that accommodates the circuit substrate;
   a plurality of connector parts provided on the circuit substrate and having an engaging portion that engages with a mating connector part, the engaging portion being exposed outward from the case, each of the plurality of connector parts provided at a different portion of the circuit substrate along a direction in which the mating connectors are mated with the engaging portions; and
   a plurality of conductive members that are electrically connected to the circuit substrate,
   wherein an end portion of the conductive members is accommodated within the connector parts respectively, and
   wherein each of the plurality of connector parts is provided to be engaged with a respective mating connector in a common direction the common direction being parallel to the circuit substrate.

2. The electrical connection box according to claim 1, wherein the circuit substrate is provided vertically in a state where the electrical connection box is attached to an attachment objective member, wherein each of the connector parts is provided with a hood portion that is provided to be spaced apart from the end portion of the conductive member, the hood portion covering a lower periphery of the end portion of the conductive member, and wherein the hood portion is formed with an opening that opens downward with respect to the vertical direction.

3. The electrical connection box according to claim 2, wherein the plurality of connector parts include:

an upper connector group provided at an upper portion of the circuit substrate with respect to the vertical direction; and a lower connector group provided at a lower portion of the circuit substrate with respect to the vertical direction.

4. The electrical connection box according to claim 3, wherein the lower connector group is provided within a projective area of the upper connector group when viewed from the vertical direction in a state where the electrical connection box is attached to the attachment objective member.

5. The electrical connection box according to claim 3, wherein at least a part of the conductive member includes:

an attachment portion that is attached to the circuit substrate;

an upraised portion that is upraised from the attachment portion by bending; and an extending portion that is bent from the upraised portion and extends in a direction opposite to an extending direction of the attachment portion, and wherein an end portion of the extending portion is provided to protrude inside the upper connector group.

6. The electrical connection box according to claim 1, wherein the conductive member includes:

a bus bar; and a terminal accommodated in the connector part, the terminal being connected with the bus bar by welding or by pressure welding.

7. The electrical connection box according to claim 1, wherein the conductive member includes:

a bus bar;

a terminal accommodated in the connector part; and a connecting member that connects the bus bar and the terminal.

* * * * *